(12) United States Patent
Eurlings et al.

(10) Patent No.: US 7,148,952 B2
(45) Date of Patent: Dec. 12, 2006

(54) LITHOGRAPHIC APPARATUS AND DEVICE MANUFACTURING METHOD

(75) Inventors: Markus Franciscus Antonius Eurlings, Tilburg (NL); Johannes Jacobus Matheus Baselmans, Oirschot (NL); Hako Botma, Eindhoven (NL); Jan Bruining, Eindhoven (NL); Marcel Mathijs Theodore Marie Dierichs, Venlo (NL); Antonius Johannes Josephus Van Dijsseldonk, Hapert (NL); Judocus Marie Dominicus Stoeldraijer, Bladel (NL)

(73) Assignee: ASML Netherlands B.V., Veldhoven (NL)

( * ) Notice: Subject to any disclaimer, the term of this patent is extended or adjusted under 35 U.S.C. 154(b) by 61 days.

(21) Appl. No.: 10/976,314

(22) Filed: Oct. 29, 2004

(65) Prior Publication Data
US 2005/0146702 A1 Jul. 7, 2005

(30) Foreign Application Priority Data
Oct. 31, 2003 (EP) .................................. 03078463

(51) Int. Cl.
*G03B 27/42* (2006.01)
(52) U.S. Cl. ............................. 355/53; 355/61; 355/71; 378/34; 378/35

(58) Field of Classification Search ..................... None
See application file for complete search history.

(56) References Cited

U.S. PATENT DOCUMENTS 6,597,430 B1 * 7/2003 Nishi et al. .................... 355/53

* cited by examiner

*Primary Examiner*—D. Rutledge
(74) *Attorney, Agent, or Firm*—Pillsbury Winthrop Shaw Pittman, LLP

(57) ABSTRACT

The present invention provides a lithographic apparatus comprising an illumination system for providing a projection beam of radiation. The illumination system comprises at least one movable optical element (7), such that a projection beam of radiation (4) can be shifted around a central position. This ensures that inhomogeneities in the intensity distribution in the projection beam (4) will be smeared out, which in turn provides an improved homogeneity of the exposure of a surface to be illuminated by the system, such as a wafer or other substrate. The optical element (7) may comprise a motor movable mirror, prism, filter, lens, axicon, diffuser, diffractive optical array, optical integrator, etc. The invention further provides a device manufacturing method, using a lithographic apparatus according to the invention, wherein the optical element is moved, in order to provide an optimum homogeneity for the projection beam of radiation.

20 Claims, 6 Drawing Sheets

LITHOGRAPHIC APPARATUS AND DEVICE MANUFACTURING METHOD

This application claims the benefit of priority from European Patent Application No. 03078463.1, filed Oct. 31, 2003, the entire content of which is incorporated herein by reference.

BACKGROUND OF THE INVENTION

1. Filed of the Invention

The present invention relates to a lithographic apparatus and a device manufacturing method. In particular, the invention relates to a lithographic apparatus comprising an improved illumination system.

2. Description of the Related Art

Generally, an illumination system is a system for providing a beam of radiation, in order to illuminate an object. Said illumination may be desired for instance in order to be able to view the object, to expose the object to said radiation in order to start or maintain a chemical reaction, and so on.

A known instance of such an illumination system is a slide projector. In a slide projector, as in other illumination systems, it is important that the quality of the beam of radiation is high. For example, for many application, the intensity of the beam should be equal in every part of the beam cross-section. This requirement of homogeneous intensity over all of the beam may be even stricter for an illumination system in special applications, in particular a lithographic apparatus. Lithographic apparatus as intended in the present application will be elucidated hereinbelow. In a lithographic apparatus, radiation is used to impart patterns to specially prepared substrates. The substrates are made light sensitive. Features on the substrate, such as dimensions and definition thereof, are highly dependent of a.o. the beam being as homogeneous as possible over all of its cross-section.

For the purpose of the present invention, the words 'beam', 'projection beam' and 'beam of radiation' are in principle interchangeable terms. Note, however, that in some cases 'projection beam' is used specifically for a beam that will illuminate a patterning device, and a 'patterned projection beam' is used for a beam that has been patterned by striking a patterning device. The beam of radiation generated by a source (and subsequently collimated by a collector) that is being conditioned in the illumination system (illuminator) is sometimes referred to as the intermediate beam or just as the beam of radiation. The projection beam obviously has a direct relationship to this intermediate beam of radiation. The invention relates to improving the homogeneity of the intensity of a beam in general, whether or not specific patterning devices are used, but whenever a distinction is to be made between a beam in general and a (patterned) projection beam, this will be clear from the context. It is particularly important that the projection beam is as homogeneous as possible, since after patterning the possibilities to correct uniformity without affecting the pattern are limited.

Existing illumination systems, in particular for lithographic apparatus, are not always satisfactory as to the requirement of having a sufficiently homogeneous intensity of the projection beam of radiation. This is sometimes referred to as a sufficient uniformity.

In particular, present lithographic scanners still suffer from high spatial frequency non-uniformities, after low spatial frequency non-uniformities have been corrected. High spatial frequency modulations in intensity are not acceptable in, for example, the production of CCD (Charge Coupled Device). In addition, high spatial frequency non-uniformities may lead to increased levels of LER (Line Edge Roughness).

SUMMARY OF THE INVENTION

It is therefore an object of the present invention to provide a lithographic apparatus comprising an improved illumination system having an improved homogeneity of the projection beam of radiation over at least a part of its cross-section.

This object is reached according to the present invention with a lithographic apparatus comprising:

an illumination system for providing a projection beam of radiation;

a support structure for supporting a patterning device, the patterning device serving to impart the projection beam with a pattern in its cross-section;

a substrate table for holding a substrate; and a projection system for projecting the patterned beam onto a target portion of the substrate, characterized in that the illumination system comprises an optical element located at least partly in said beam of radiation for improving a uniformity of said beam of radiation, wherein the optical element comprises a surface capable of redirecting said beam of radiation and is constructed to perform a movement around a central position.

By providing an optical element having a reflective surface, and constructed to be able to perform a movement about an initial position, the homogeneity of the spatial intensity of the exposure and/or the intensity averaged over time are improved. In a first aspect, the movement of the optical element is used to bring this optical element in a position in which it redirects a part of the beam of radiation, such that the resulting beam of radiation has an improved spatial homogeneity, by reflecting a part of the beam having a too high intensity either out of the beam or towards another part of the beam having a too low intensity. This directly improves the spatial homogeneity of the intensity. In a second, aspect, the optical element ensures that the beam of radiation is moved across the intended surface (e.g. a patterning device), such that the total intensity, as averaged over the duration of an intended illumination (or exposure), is improved.

This principle may be used in for example stepping and scanning lithographic apparatus, to name but a few of the possible applications. The frequency of the movement may be different for various types of apparatus, in order to be able to adequately smear out the intensity distribution, and prevent unwanted effects of moving the beam.

Advantageously, a motor for driving the optical element is provided and connected thereto. This offers good control over the movement of the optical element. Such a specific motor is however not always required. This will be elucidated hereinbelow.

Advantageously, the optical element comprises one of a mirror, a prism, a filter, a lens, an axicon, a diffuser, a diffractive optical array, and an optical integrator. Herein, the mirror is for example a flat, metal or dielectric mirror, and the prism is advantageously a triangular prism with one mitre or roof prism. However, the prism may also comprise a wedge shaped prism such as for example used in current retarders used for depolarization purposes. Such optical elements may be made with high precision and stability, and may be controlled and manipulated easily. A mirror has the advantage that no radiation needs to be transmitted therethrough. This allows a larger gamut of materials for a mirror.

Note that it will almost always be possible to introduce a movable optical element, such as a mirror or prism into the beam, since basically they will not change the beam shape or other properties.

In an advantageous embodiment, the optical element comprises a non-flat mirror. This offers the possibility of combining two effects. The first is the actual movement of the mirror, which is a dynamical effect in that it may move the beam all over the desired surface. Note that this may be any desired movement, from a linear or swinging movement to any irregular or "wild" movement. This may be brought about with e.g. flat mirror(s), such as with a polygon, combined with appropriate driving of the mirror(s), but also with a simple drive (e.g. a rotary drive) and a complicated mirror surface, or a combination thereof. The second is an inherent effect on the intensity distribution due to the shape of the mirror. This offers a variety of design possibilities. Some examples are curved mirrors, like concave mirrors and convex mirrors, irregularly shaped mirrors, and combinations thereof. Note that the latter may improve or correct a lens action (or focus). In case the focus is already optimum before applying any action by the (curved) mirror, then still this offers the possibility of movement of the beam, as described above.

In another advantageous embodiment, the optical element comprises a filter. For various reasons it may be advantageous to filter out undesired radiation. For example, a filter may be placed in the optical path of the beam of radiation to improve its static uniformity, for example by having a transmission or reflection profile matched to the intensity profile of the beam of radiation. Another filter, such as a spectral purity filter, may be used for wavelength selection. Especially in the case of reflective filters, such as is the case for EUV radiation, a movement of the filter will influence the beam of radiation in the desired way according to this invention.

In another embodiment, the optical element comprises a lens, such as for example a zoom lens, or an axicon which are both generally known optical elements used in conventional illumination systems. The lens is moveable in the direction of the optical axis. In certain embodiments, random vibrational movement corresponding to pink, white or Gaussian noise is applied to the lens.

In another embodiment, the optical element comprises a diffuser or a diffuser plate, which is often used in illumination systems to slightly increase the divergence of a beam of radiation. The diffuser can be placed anywhere in the optical path, for example in a field plane or in a pupil plane. The diffuser can be rotated around the optical axis, or it may be brought in a vibrational motion. The diffuser may have a flat or substantially flat transmission profile, but alternatively it may have a predetermined or random transmission profile. Finally, the diffuser can be reflective or transmissive.

In another embodiment, the optical element comprises a diffractive optical array. A diffractive optical array, often also referred to by diffractive optical element (DOE) or refractive optical element (ROE) or holographic optical element (HOE), can currently be used in illuminators to form a quasi uniform field intensity. Especially when the illuminator is used in low sigma mode (<0.3) the amount of array elements of the diffractive optical array is limited, and a movement of the optical element perpendicular to the beam will increase the averaging of overlapping fields and thereby improve the field uniformity.

In another embodiment, the optical element comprises an optical integrator such as for example a crystal rod (made of Quartz or CaF) or for example a fly's eye lens. These optical elements, similar to the diffractive optical array, also define the field in the illuminator and by letting these elements perform a vibrating or oscillatory movement, static speckle will become dynamic speckle and will be smeared out thereby improving micro uniformity.

In principle, there are no particular limitations to the kind of radiation used. However, the invention has particular advantages when the radiation has a wavelength of shorter than 400 nm, in particular shorter than 250 nm, more particular shorter than 30 nm. For wavelengths shorter than about 400 nm, and even more so for wavelengths shorter than 250 nm, it is rather difficult to find optical materials that transmit the radiation satisfactorily, this being limited to (fused) quartz, some fluorides etc. Use of a mirror will prevent transmission problems, as mentioned above.

For wavelengths shorter than about 30 nm (Extreme Ultraviolet, or EUV) there are no reasonably transparent materials known, although it is not excluded that they may be found in the future. Hence, use of a movable mirror offers, for the first time, a possibility of improving the homogeneity of a bundle of radiation with a wavelength of shorter than about 30 nm.

In particular, optics for very short wavelength radiation, such as EUV radiation, consist primarily of mirrors. E.g. the collector may comprise a number of concentrically arranged mirrors, such that these will concentrate (diverging) radiation that enters the collector. This arrangement of concentric mirrors is very sensitive to changes in geometry due to e.g. temperature changes. A change in geometry may cause a change in focus, or at least a change in the homogeneity of the exiting beam. For example, sharp dips in the intensity may arise. For these particular cases the illumination system according to the invention provides a marked improvement in the homogeneity of the illumination.

Advantageously, said movement is a rotary movement, or an oscillatory movement (or a vibrational movement). These are movements which are well controllable, and of which the effect on the beam, and hence the exposure is easily calculable.

In another advantageous embodiment, the optical element is connected to an external source of vibrations which is mechanically decoupled from the radiation source and the collector. This means in practice that both the source of radiation, and the collector have been suspended in a structure which has been decoupled from vibrations from the outside world, by way of a vibrations damper. Furthermore, advantageously, the optical element is either not decoupled from these outside vibrations by way of a direct coupling with the outside world, or the optical element is connected to a separate source of vibrations. In the first case the outside world is considered to be the source of vibrations. An advantage thereof is that it is always available, while an advantage of a separate source of vibrations is that its vibrations are much more controllable.

In an advantageous illumination system, the optical element is a polygon which is movable around an axis perpendicular to at least part of the radiation in the projection beam, and a motor may be provided for rotating said polygon. This is a rather simple and yet elegant way of providing a periodic moving of the optical element. At any given instant, the beam of radiation will strike one (or possibly more) faces of the polygon. When the polygon has rotated over a sufficient angle, a 1 face of the polygon will take over reflection of (at least a part of) the beam of radiation, and so on. One advantage of a rotational movement over a vibrational movement is precisely the absence of vibrations in the first. When the type of movement is of a vibrational nature, decoupling is needed to prevent vibrational problems in others parts of the system, because of occurring forces to accelerate or decelerate the vibrating parts, while a rotational movement may be performed substantially free from vibrations.

For the purposes of this invention, the polygon need not be a perfect geometrical polygon, but may have, for example, rounded edges between faces. In particular, the faces of such a polygon may be substantially flat, or substantially curved, or even irregularly shaped. The same considerations apply as with respect to the shape of the mirror as discussed above. Furthermore, each face of the polygon may comprise a differently shaped face, in order to further improve the possibilities to influence the properties of the beam of radiation. Moreover, the polygon may have faces of substantially equal dimensions, or may alternatively comprise faces of different dimensions.

In a further embodiment, the optical element comprises a circumferential mirror. This may be considered as a special case of a polygon, in which the faces are curved such as to produce a smooth surface. Note that a perfect cylinder that rotates round an axis of symmetry thereof will not vary the intensity distribution of the beam. Hence it may be arranged to rotate or move such a cylindrical mirror round a non-symmetry axis. More generally, however, the circumferential mirror may be smooth and non-cylindrical or even irregularly shaped, e.g. having an oval or locally bulged cross-section. Such general shape of the mirror may be optimized for the desired smear out properties with respect to the beam of radiation.

The abovementioned rotational movement may be seen as a special oscillatory movement. In general, such an oscillatory movement has the advantage that the effect of the movement on the beam is even more predictable, with easily controlled features, such as frequency and amplitude of the oscillation.

In another advantageous embodiment of the invention, at least one optical element is deformable and comprises deformation actuators for deforming the surface of the optical element. This allows a very specific, local control of the reflection properties of the optical element. Note that the term 'movement' now comprises deformation, and that the expression 'around a central position' is intended to mean 'with respect to a non-deformed position'.

An example is a compound mirror with local facet like action, in case the overall surface of the mirror is locally deformed. Other, equally non-limitative examples include mirrors that are more or less flexible, wherein one or more deformation actuators are connected to the mirror, at various positions of the mirror. The deformation actuators may comprise piezo-electrical motors or any other type of drivers that are able to bring about a deformation of the surface. Generally, this allows a deformation of the mirror, such that the beam of radiation, or at least a part thereof, may be redirected. In turn, this redirecting may be controlled as to sweep the beam across the targeted surface of a substrate etc., or to take away parts of the beam with a too high intensity, or to guide those too intensive parts towards parts of the beam that have a too low intensity.

In an advantageous embodiment of the illumination system according to the invention, the projection beam has a focal point with a minimal cross-sectional area, and the optical element is located at said focal point. Herein, a focal point is to be understood as a position in which the cross-sectional area of the beam is smaller than at exiting the collector, and in certain embodiments, at most half, or more specifically, at most one-tenth, of the cross-sectional area at exiting the collector. This allows the possibility to control the shifting of the beam with as small an optical element as is feasible, with the corresponding lower cost and less mechanical problems.

It is to be noted that it will be possible to combine two or more embodiments of the invention in one and the same larger system or apparatus, in order to further improve the homogeneity of the beam.

The illumination system according to the invention may be applied in, in principle, any desired larger system. However, one useful application is in the field of lithography, because of its inherent extreme demands as to illumination and homogeneity thereof, and often at rather short wavelengths.

Advantageously, the radiation has a wavelength shorter than 400 nm, and the collector and/or at least one optical element comprises a reflector having a plurality of facets, such that each facet reflects a part of the collected radiation in a partial beam, wherein the partial beams overlap in a plane at a distance from the reflector. This type of reflective optics is very useful for wavelengths for which no sufficiently transmissive materials are known, e.g. EUV radiation, of say between 5 and 30 nm. Since this kind of optics already uses one or more mirrors to guide and direct the radiation, inclusion of another movable mirror as an optical element for introducing the advantageous shifting of the beam, according to the invention, poses few, if any problems, yet provides the advantages of improving homogeneity as described above.

In practice, a collector can also be e.g. a concave mirror in order to obtain a beam of radiation, whereas a separate mirror will comprise a number of facets. It is also possible to replace one or more of the mirrors already present by one or more additional, movable mirrors.

Other wavelengths than those shorter than 400 nm are not excluded, however. Furthermore, any other type of illumination system according to the invention may be provided in the lithographic apparatus, with its specific advantages as already described in connection with the illumination system.

In a second aspect of the invention, there is provided a device manufacturing method comprising:

providing a substrate;

providing a projection beam of radiation;

using a patterning device to impart the projection beam with a pattern in its cross-section; and projecting the patterned beam of radiation onto a target portion of the substrate, wherein a lithographic apparatus according to the invention is used, characterized by moving the optical element around a central position during projecting.

Herein, said moving may e.g. be of a vibrational, an oscillatory or a rotational type. Any type of lithographic apparatus according to the invention may be used, with its described specific advantages. Herein, the lithographic apparatus may be used to provide the projection beam of radiation, to impart a pattern to that projection beam, and/or to project the patterned projection beam of radiation onto the target portion.

Having thus described the present invention, next some background information is given for the purpose of better understanding the invention. This information should, however, not be construed as limiting.

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. Further, the substrate referred to herein may be processed, before or after exposure, in for example a track (a tool that typically applies a resist to a substrate and develops the exposed resist) or a metrology or inspection tool. Where applicable, the disclosure herein may be applied to such and other substrate processing tools.

The terms "radiation" and "beam" used herein encompass all types of electromagnetic radiation, including and in particular, ultraviolet (UV) radiation (e.g. having a wavelength of 365, 248, 193, 157 or 126 nm) and extreme ultra-violet (EUV) radiation (e.g. having a wavelength in the range of 5–20 nm). In principle, it may also include particle beams, such as ion beams or electron beams, provided a mirror may be used for such beams.

The term "patterning device" used herein should be broadly interpreted as referring to devices that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EMBODIMENTS OF THE INVENTION

Figure 1:
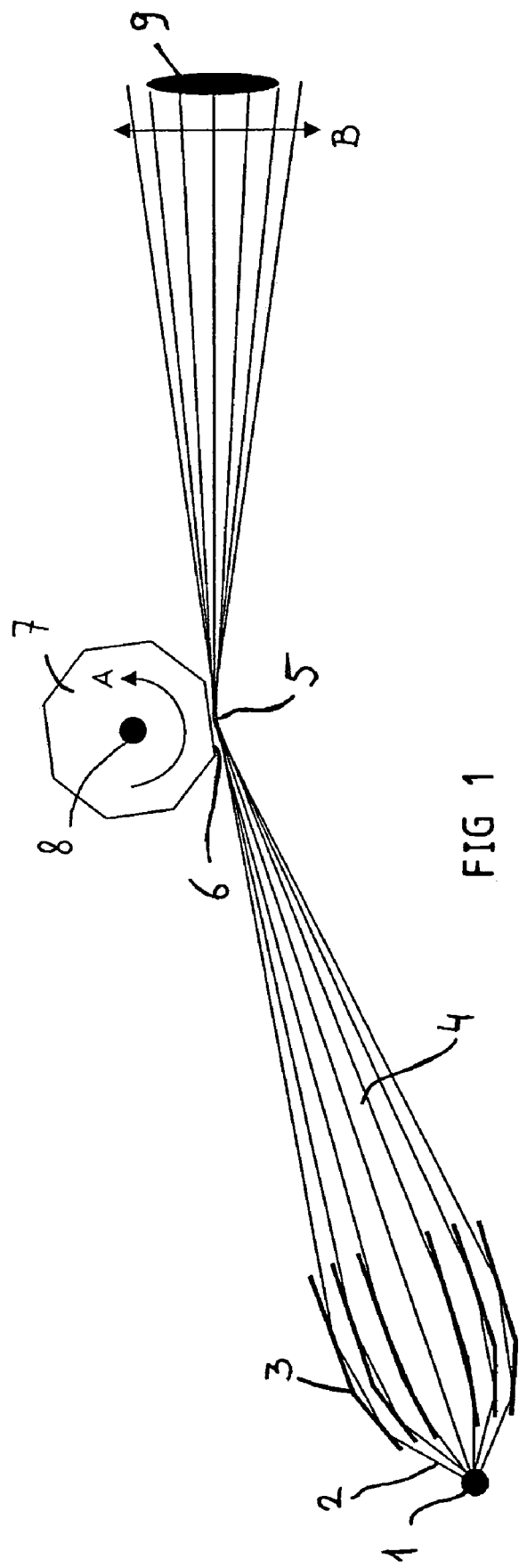
FIG. 1 schematically depicts an illumination system according to the invention.

FIG. 1 schematically depicts an illumination system according to the invention. The illumination system comprises a source 1 of electromagnetic radiation 2. The radiation 2 enters a collector 3 and is formed into a beam 4 of radiation.

The beam 4 of radiation has a focal point 5, at which it reflects off a face 6 of a polygon 7. The polygon 7 rotates around an axis 8 in the direction indicated by arrow A, and is driven by a motor (not shown).

The reflected beam oscillates back and forth in the direction of arrow B, and strikes a mirror 9.

The source 1 may be any source of radiation that is useful for the desired kind of illumination. In many cases this will be electromagnetic radiation, often with wavelengths up to about 1000 nm. In the particular case of lithography, this is most often ultraviolet radiation, having wavelengths from about 400 nm (e.g., 365 nm) down to as short as between 5 and 20 nm (extreme ultraviolet, EUV). In the embodiment of FIG. 1, the radiation comprises EUV radiation, having a wavelength between about 5 and 30 nm. However, longer wavelength radiation, such as visible light, is not excluded, nor are other types of radiation, such as particle beams.

The radiation 2 coming from the source 1 often has a strongly divergent character. Therefore, often a collector 3 is used in order to form the emitted radiation 2 into a converging beam 4 of radiation. The design of the collector 3 depends e.g. on the type of radiation 2 to be bundled, and on the properties of the beam 4 to be formed. In the embodiment of FIG. 1, the collector 3 comprises a number of concentric shell-like bodies. Each of these bodies has a shape such that incoming radiation 2, in grazing incidence, is reflected off the body in the direction of a focal point 5. In reality this focal point 5 will be more like a focal volume, since the collector has a discrete nature, and will not be able to focus every single ray of radiation onto the same point. Nevertheless, the collector 3 will act as a "lens", and will create a point in space, the focal point 5, where the cross-sectional dimensions of the beam 4 of radiation are much smaller than at exiting the collector 3.

Note that in the case of EUV radiation, it is at present necessary to use reflective optics, e.g. in the form of the described collector, to focus the radiation. It is however not ruled out that other types of focusing mechanism may be employed in the future. The actual type of focusing mechanism is however irrelevant for the invention. As an example, when longer wave radiation is used, such as UV radiation having a wavelength of between about 200 and 400 nm, it is very well possible to use real lenses made of quartz, CaF, etc. In this case it is possible to focus the beam 4 of radiation to a very small focal point 5. Yet other types of collectors are possible for all kinds of radiation, for example a concave mirror extending partly around the source, opposite the side from which the collected beam is emitted. The source may be located in or near a focal point of such a concave mirror, in order to emit a parallel or nearly parallel beam.

In the focal point 5, the beam 4 of radiation strikes a face 6 of a polygon 7 and is reflected off said face 6. The polygon shown in FIG. 1 is an octagon, but any number of faces is also possible, such as 4, 5, 6, 7, 9 etc. A number of at least six is preferred, more preferably at least eight, because then the amplitude of the beam 4, or in other words the maximum shift from a centered position of the beam, may be kept relatively small. This enables the beam 4 to be used efficiently because it will strike its intended surface, in this case the mirror 9, for a large part of the time, and yet will move such as to average out inhomogeneities in the intensity of the beam 4.

It is not necessary to use a polygon 7 as the way of providing a reflective surface like the face 6. Other devices include, among others, a simple mirror, either flat, concave or convex, or e.g. a prism. Said prism should be sufficiently transparent for the radiation 2 used. In such case the radiation that entered the prism will experience total internal reflection off the hypotenuse, provided the prism is oriented correctly. This is however a simple task for the person skilled in the art.

In order to shift the beam 4 the polygon 7 is moved around an axis 8, by way of a motor (not shown). The polygon may be rotated around the axis 8, e.g. in the sense of arrow A, or in the reverse sense. Rotating will induce only a small amount of vibrational disturbance in the system, which is advantageous for sensitive systems, such as lithography systems, which in all will require very high accuracy of the actual exposure by the beam 4. Yet other methods of moving the polygon are not excluded, such as actually vibrating the polygon, or causing the polygon to perform an oscillating or "rocking" movement back and forth around a central position. The vibrational movement need not be performed around an axis, but may be brought about by coupling the polygon, or surface etc., to some source of vibrations, such as the outside world, as contrasted to the system in which most parts like source, collector and mirror 9 are suspended in a vibrationally damped structure. A source specifically designed to generate vibrations may be used as well, with the additional advantage that the average amplitude may be set as desired. The oscillating or "rocking" movement may be brought about by any known method, such as a small piston engine or the like.

In the context of this application, the term "initial position" is meant to indicate a basic position of an optical element. That is, the optical element is intended, during use, to be positioned such that a beam of radiation will strike it in a certain manner. That position constitutes a basic position of the element, though there is, in principle, no need for the element to return to that position between exposures. In general, as can be seen in FIG. 1, for example, is a position, and corresponding attitude, at which light impinging on the optical element 7 will be projected to impinge on a second optical element 9. Movement, in this context, of the optical element encompasses rotational, translational and/or oscillatory movement. The shifting, or generally the movement, of the reflected beam on the surface of mirror 9 will be in the direction of arrows B. It is to be noted that in another embodiment, e.g. in the case of a vibrationally driven movable optical element, this direction may be completely random, or in a direction perpendicular to B.

The motor to be used for rotating the polygon may be any suitable motor, and will often be an electromotor. The number of revolutions per minute may be set to any desired and appropriate number. The person skilled in the art will advantageously select a number such that the duration of an exposure by the illumination system will comprise at least one complete cycle of the movement performed by the polygon. In this case full advantage may be taken of the smearing out effect of that movement. However, even a small part of the movement will bring about some homogenizing effect.

As indicated above, the position of the face 6 of the polygon 7 is advantageously in a focal point of the illumination system. This is however not necessary, since the beam 4 may be reflected at any position between the collector 3 and the intended surface. In this case, the intended surface is a mirror 9. This mirror may be one facet of a facet mirror, but it may also be some other mirror used in the illumination system, and it could also be a patterning device in a lithographic system. This will be more elucidated in the following Figures and their description.

Figure 2:
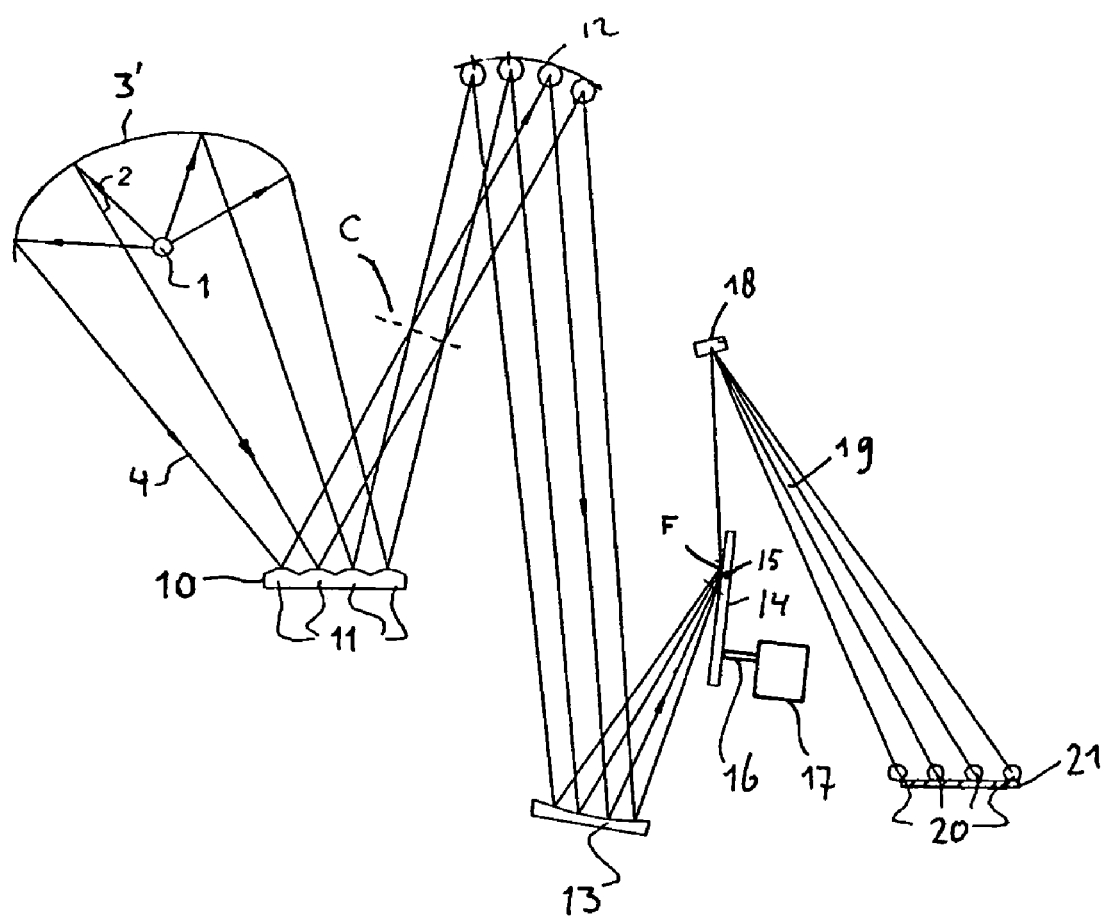
FIG. 2 schematically shows a second embodiment of the illumination system according to the invention.

FIG. 2 schematically shows a second embodiment of the illumination system according to the invention. Like elements are indicated by like reference numerals, sometimes with a prime for clarity.

The collector is now a concave mirror 3', wherein the source 1 is located near a focal point of the collector 3'.

A beam 4 of radiation is formed and strikes a so called field facets mirror 10, comprising a number of tiny separate convex mirrors 11, the field facets. These field facets may be compared with mirror 9 of the embodiment of FIG. 1. It is noted here that in practice the illumination system according to the invention may be supplemented by any known other devices, such as lenses, shutters etc. This holds for all other embodiments as well.

C denotes a location where the dimensions of the beam 4 are locally smallest.

After reflection by the field facets mirror 10, the beam 4 is reflected by a number of other mirrors 12 and 13, the function of which will not be elucidated further here. Next, the beam is reflected by a mirror 14, which is arranged at grazing incidence.

Mirror 14 may be rotated back and forth around an axis 15, by way of an arm 16, which is connected to a motor 17.

After reflection by mirror 14, the beam 4 strikes a patterning device 18, and becomes a patterned beam 19.

In this embodiment, a concave mirror 3' is used to bundle the radiation 2 emitted by source 1 in a converging beam 4. Thereto the source 1 should be located slightly further away from the mirror 3' than the position of a focal point of said mirror 3'.

The beam 4 next strikes the surface of a field facets mirror 10, comprising a number of field facets, which may be flat mirrors, slightly tilted and/or offset with respect to each other. In the present embodiment they are each tiny convex mirrors, here in order to provide small separate beams. This is however not relevant for the present invention, and hence will not be elucidated further.

The beam, or collection of separate beams, that is reflected by mirror 10 has a smallest diameter, or in general a smallest dimension, in a position C. This position offers an advantageous position for including a movable reflecting surface, such as an extra mirror, according to the invention. This is however not shown here, because such movement is provided in another part of the illumination system.

Beam 4 is further reflected by mirror 12 and by mirror 13, each of which might also be made movable to provide a movement, according to the invention. The function of said mirror 13 may be for example to collimate the beam 4, and to form a focal point F.

Next, the beam 4 strikes the mirror 14. E.g., mirror 14 is a flat or slightly convex mirror, which is arranged at grazing incidence. As described, the beam 4 strikes the mirror 14 in a focal point F. Hence the beam is easily controlled when imparting a movement to the mirror 14. In other words, mirror 14 is a good candidate to be designed as a movable mirror, according to the invention. In this embodiment this has been realised by way of a movable arm 16, which is connected to and driven by a motor 17. This motor 17 plus arm 16 may be an electromotor, piston engine or any type suitable to impart a to-and-fro-motion to the mirror 14, such that the beam reflected by the mirror shifts back and forth.

In an alternative embodiment the motor may comprise a source of vibrations, which is rigidly coupled to the mirror 14 by way of arm 16. The source may be the outside world, producing vibrations by way of ever present human, seismic or industrial activity. In a specific embodiment motor 17 comprises a controllable vibrations generator, with a settable amplitude and frequency (spectrum).

Note that in none of the illumination systems according to the invention it is necessary to impart a movement around one axis. It is also possible to impart a movement around two or more axes, or around a ball joint, such that a movement is possible in generally any direction. The important thing is that the beam will shift across the surface to be illuminated, such that irregularities in the intensity at that surface are smeared out, and the homogeneity of the illumination is improved.

The beam that is reflected by the mirror 14 will strike a surface to be illuminated, in this case a patterning device, although it may also be e.g. a surface which is sensitive for the radiation, which may be cured by the radiation and so forth.

Figure 3:
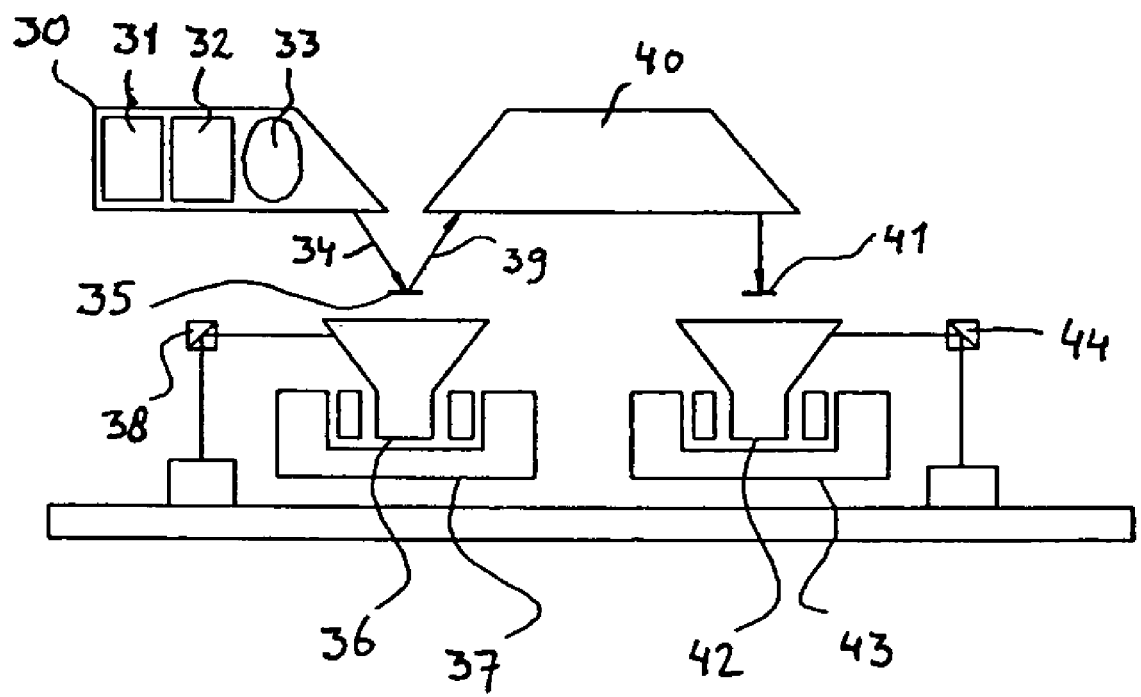
FIG. 3 shows schematically a lithographic apparatus according to the invention, in particular a lithographic apparatus employing reflective optics.

FIG. 3 shows schematically a lithographic apparatus according to the invention, in particular a lithographic apparatus employing reflective optics.

A schematic illumination system according to the invention is generally denoted by 30. 31 denotes a source of radiation, 32 denotes a collector, i.e. for example beam shaping elements, and 33 denote further optical elements, in particular a movable optical element, according to the invention.

A projection beam 34 is emitted and strikes a mask 35, coupled to a mask table 36 which is movable by mask table positioner 37 which in turn is controlled by a first interferometer 38.

A patterned beam 39 enters projection optics 40, and is guided towards a wafer 41, which is coupled to a wafer table 42, which is coupled to wafer table positioner 43, which in turn is controlled by a second interferometer 44.

Most parts of the apparatus of FIG. 3 may in fact be standard parts of a lithographic apparatus. Furthermore, since they have been generally introduced in the introductory part of this description, a further elucidation will be limited to parts according to the invention, together with only a general explanation.

The illumination system 30 is designed according to the invention, and provides a projection beam 34. This projection beam shows a better homogeneity than known projection beams, at least when measured over a complete exposure of e.g. a wafer 41. This is achieved by way of a movable optical element forming part of the further optical elements 33.

After patterning the projection beam 34, the patterned beam 39 is guided and or conditioned by projection optics 40. The projection optics may comprise one or more mirrors/ and or lenses, or may be dispensed with altogether.

It is noted that the embodiment of FIG. 3 with the reflective optics will be suitable for use with very short wave electromagnetic radiation and possibly with particle beams, for reasons already explained above.

Figure 4:
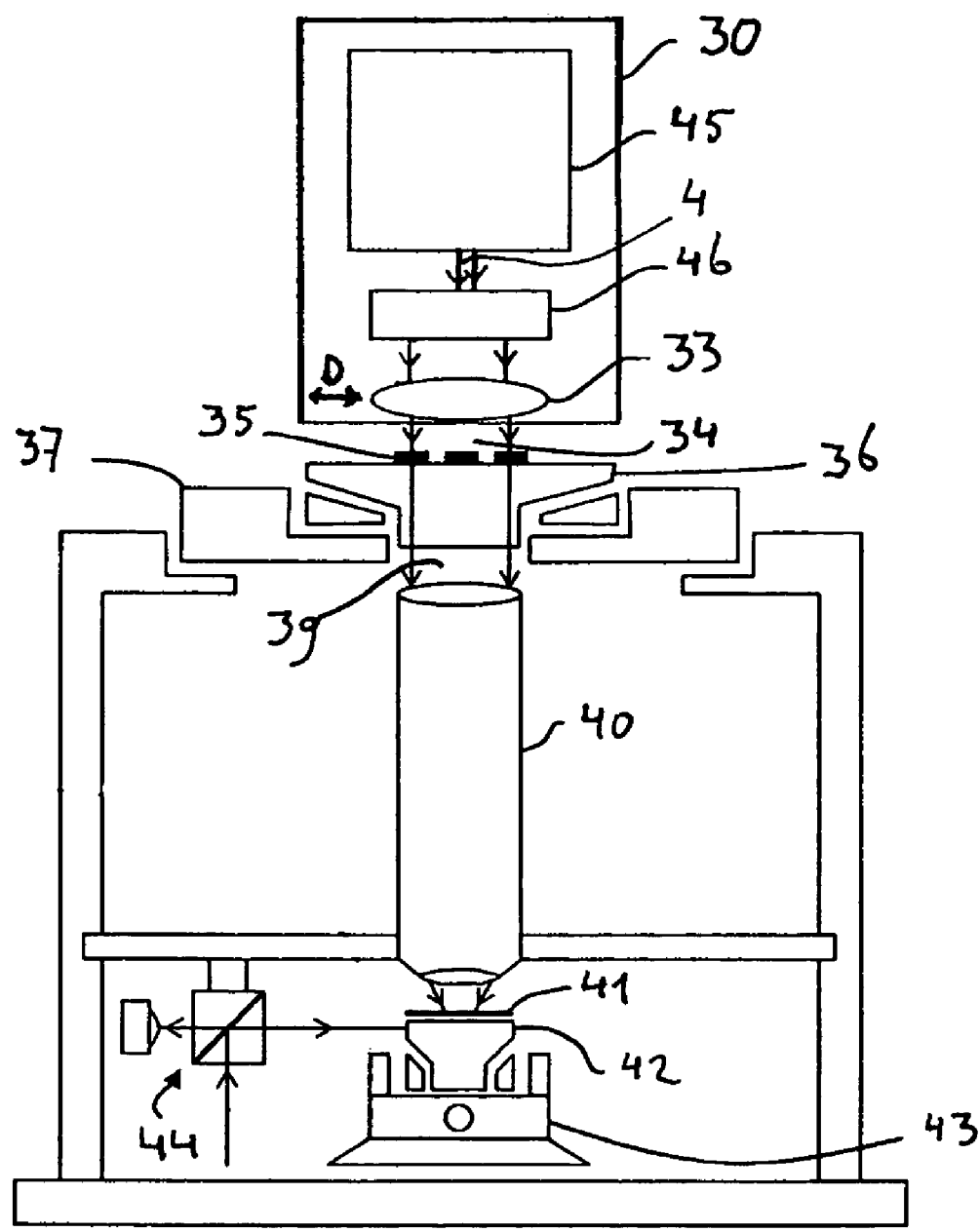
FIG. 4 shows a schematic set-up for another embodiment of a lithographic apparatus according to the invention, but now with transmissive optics.

FIG. 4 shows a schematic set-up for another embodiment of a lithographic apparatus according to the invention, but now with transmissive optics.

An illumination system according to the invention is indicated by 30, wherein 45 denotes a laser, and 46 denotes a beam expander.

The reference numerals 33 through 37 and 39 through 44 denote parts corresponding to the parts in FIG. 3 with the same reference numerals.

The transmissive optics of this embodiment may be used in the case where radiation is used for which there are sufficiently transparent materials, in particular for radiation having a wavelength of longer than about 100 nm.

The laser 45 is selected as an alternative radiation source combined with a collector. A laser provides a parallel beam 4 of radiation, which may need to be expanded to a desired cross-section, by way of beam expander 46.

Further optical elements 33 may comprise other homogenizing elements, such as mode mixers etc., and also comprises a movable optical element, according to the invention. Moving of said movable optical element by way of a motor (not shown) will cause the projection beam 34 to shift in e.g. the direction indicated by arrow D. The movable element may be a mirror, prism, a lens etc. Note that it may be necessary to design the path of the projection beam towards the mask 35 such that the extra reflection by the movable element is taken into account. Especially in the case of reflection by a mirror or prism, the reflected beam, or projection beam, will not be parallel to the beam that strikes the movable optical element. This may be corrected by using another mirror, prism etc. which will add another reflection angle, which is advantageously equal to an average reflection angle by the movable optical element.

In the case that the movable element is a lens, the term "reflection" is of course to be replaced by "refraction", although the effect of moving the beam is still achievable, e.g. by moving the optical centre of the lens with respect to the beam. Hence the surface is capable of refracting said radiation.

Figure 5:
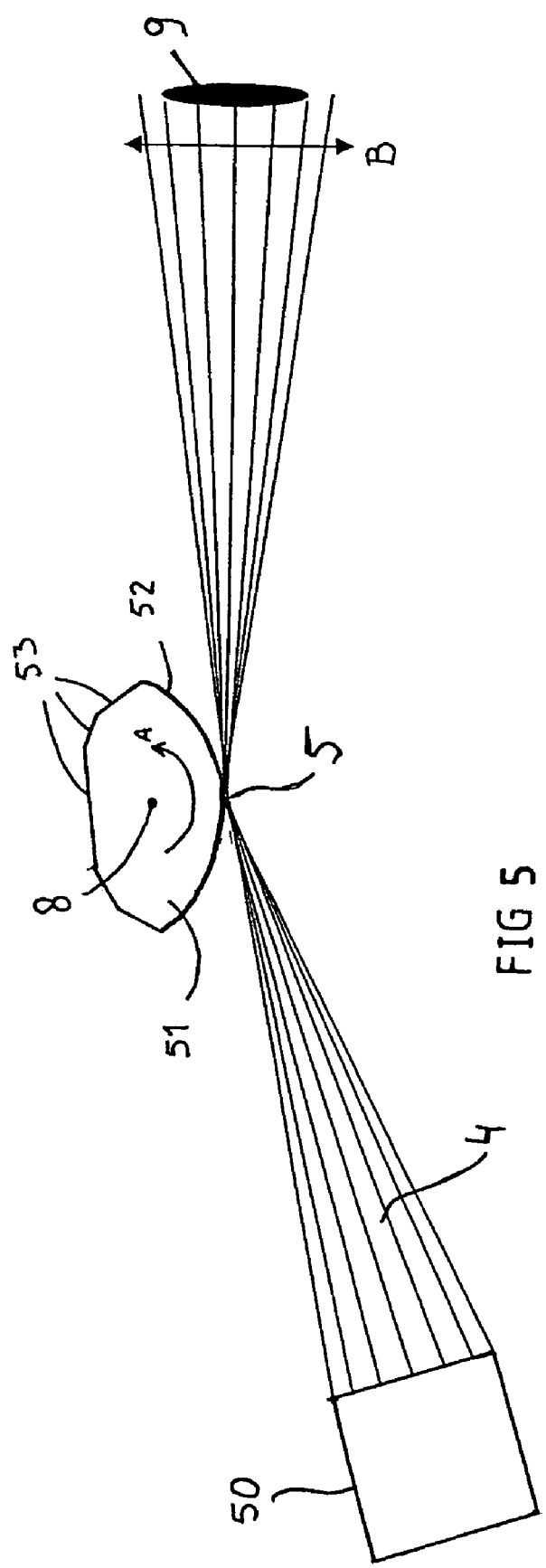
FIG. 5 shows an alternative embodiment of an illumination system according to the invention.

In FIG. 5 an alternative embodiment of an illumination system according to the invention is shown. Herein, 50 denotes a generalized source of a beam of radiation 4 which has a focal point 5.

An optical element 51 may move about an axis 8, and comprises a simple curved surface 52 as well as a number of facets 53.

The optical element 51 comprises two different main sides, a first side 52 with an ellipse-like curvature, and an opposite side comprising a number of facets 53. The facets are shown as differing from each other, although they may be selected to be equal.

The optical element 51 may be moved round an axis 8 by way of a drive (not shown), e.g. in the direction of arrow A, although some other direction is not excluded. An advantage of the sides of the optical element 51 differing from each other is that by a simple rotation over 180° a completely different optical behaviour of the element 51 may be selected. Any other number of mutually different faces is conceivable as well.

The movement around 8 may be a repetitive wiggle motion, a rotation and so forth. It may be an irregular motion or a regular motion with any appropriate speed or frequency.

Figure 6:
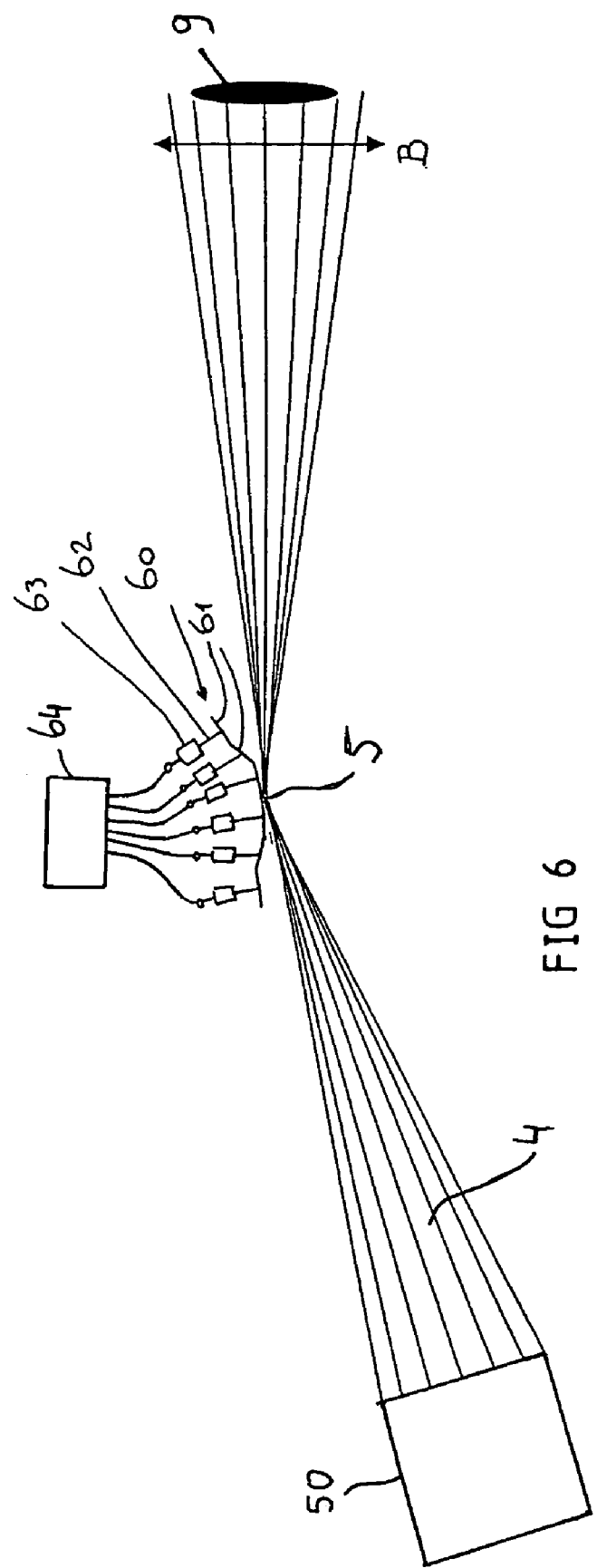
FIG. 6 shows another alternative embodiment of an illumination system according to the invention.

FIG. 6 shows another alternative embodiment of an illumination system according to the invention. Herein, 50 denotes again a generalized source of a beam of radiation 4 having a focal point 5.

Reference numeral 60 denotes a deformable optical element having a number of partial surfaces 61 each connected to a deforming arm 62, which is in turn coupled to a deformation driver 63. Each deformation driver is controlled by deformation controller 64.

Optical element 60 comprises a deformable surface, which may be built up of mutually connected partial surfaces 61 which are rigid per se, or e.g. alternatively from one integral flexible material. The partial surfaces 61 may vary in number between 2 and any desired higher integer, such as e.g. up to 30, a higher number ensuring a higher number of possible intensity patterns but also an increased complexity. The partial surfaces may be arranged linearly, or in a 2D pattern.

Each partial surface 61 may be moved by way of a deforming arm 62 which is driven by deformation driver 63. Possible embodiments are piezo-electrical actuators, magnetically controlled devices etc. All deformation drivers 63 are connected to and controlled by deformation controller 64, which may be e.g. a microcomputer, which is optionally coupled with a beam intensity measuring device (not shown). By way of the deformation controller 64 an appropriate signal may be sent to the deformation drivers 63 which in turn move the deforming arms 62 to the desired positions, such that the optical element 60 will provide a desired shift of the beam 4 across the surface of a target 9. This shift may be a sweep, an oscillatory shift, or a correction of some parts of the beam which have a too high intensity, or a combination thereof.

While specific embodiments of the invention have been described above, it will be appreciated that the invention may be practiced otherwise than as described. The description is not intended to limit the invention.

What is claimed is:

1. A lithographic apparatus comprising:
   an illumination system to condition a radiation beam;
   a support structure to support a patterning device, the patterning device serving to impart the radiation beam with a pattern in its cross-section;
   a substrate table to hold a substrate; and
   a projection system to project the patterned beam onto a target portion of the substrate;
   wherein the illumination system includes an optical element comprising a surface that is adapted to redirect the radiation beam, the optical element being moveable about an initial position such that the radiation beam impinges on the surface of the optical element at a plurality of spaced apart positions so as to improve a uniformity of the radiation beam.

2. A lithographic apparatus according to claim 1, wherein said optical element comprises a mirror, a prism, a filter, a lens, an axicon, a diffuser, a diffractive optical array, or an optical integrator.

3. A lithographic apparatus according to claim 1, wherein the radiation is electromagnetic radiation having a wavelength shorter than 400 nm.

4. A lithographic apparatus according to claim 1, wherein the radiation is electromagnetic radiation having a wavelength shorter than 250 nm.

5. A lithographic apparatus according to claim 1, wherein the radiation is electromagnetic radiation having a wavelength shorter than 30 nm.

6. A lithographic apparatus according to claim 1, wherein said optical element is moveable by a rotational movement or an oscillatory movement.

7. A lithographic apparatus according to claim 1, wherein the optical element is operationally coupled to an external source of vibrations.

8. A lithographic apparatus according to claim 1, wherein the optical element is a polygon which is movable around an axis perpendicular to at least part of the projection beam of radiation, and wherein a motor is provided to move said polygon.

9. A lithographic apparatus according to claim 1, wherein, in use, the projection beam of radiation has a focal point with a minimal cross-sectional area, and the optical element is located at said focal point.

10. A lithographic apparatus according to claim 1, wherein the radiation is electromagnetic radiation having a wavelength shorter than 400 nm, and wherein the optical element comprises a reflector having a plurality of facets, such that each facet is configured to reflect a part of the collected radiation in a partial beam, wherein the partial beams overlap in a plane at a distance from the reflector.

11. A lithographic according to claim 1, wherein said surface is an external surface of the optical element that is adapted to substantially reflect off the radiation beam.

12. A lithographic apparatus according to claim 1, wherein the surface of the optical element is substantially perpendicular to a plane of incidence of said radiation beam.

13. A device manufacturing method using a lithographic apparatus having an illumination system, the method comprising:
    patterning a projection beam of radiation;
    projecting the patterned beam of radiation onto a target portion of a substrate; and moving an optical element of the illumination system around an initial position during the projecting such that the beam of radiation impinges on a surface of the optical element at a plurality of positions so as to improve a uniformity of the radiation beam.

14. A method according to claim 13, wherein said surface is an external surface of the optical element that is adapted to substantially reflect off the radiation beam.

15. A method according to claim 13, wherein the surface of the optical element is substantially perpendicular to a plane of incidence of said radiation beam.

16. A method according to claim 13, wherein said optical element comprises a mirror, a prism, a filter, a lens, an axicon, a diffuser, a diffractive optical array, or
    an optical integrator.

17. A method according to claim 13, wherein said optical element is moveable by a rotational movement or an oscillatory movement.

18. A method according to claim 13, wherein the optical element is a polygon which is movable around an axis perpendicular to at least part of the projection beam of radiation, and wherein a motor is provided to move said polygon.

19. A method according to claim 13, wherein the radiation is electromagnetic radiation having a wavelength shorter than 400 nm, and wherein the optical element comprises a reflector having a plurality of facets, such that each facet is configured to reflect a part of the collected radiation in a partial beam, wherein the partial beams overlap in a plane at a distance from the reflector.

20. A lithographic apparatus comprising:
    an illumination system to condition a radiation beam, the illumination system including:
        an optical element that is moveable about an initial position such that a uniformity of the beam is improved, the optical element including a deformable surface capable of redirecting the radiation beam, and
        actuators constructed and arranged to deform the surface of the optical element;
    a support structure to support a patterning device, the patterning device serving to impart the radiation beam with a pattern in its cross-section;
    a substrate table to hold a substrate; and
    a projection system to project the patterned beam onto a target portion of the substrate.

* * * * *